United States Patent
Takenaka et al.

(10) Patent No.: US 6,778,403 B2
(45) Date of Patent: Aug. 17, 2004

(54) WIRING BOARD HAVING TERMINAL

(75) Inventors: Masatoshi Takenaka, Fukui (JP); Minoru Hato, Osaka (JP); Shinji Okuma, Fukui (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 10/399,684

(22) PCT Filed: Sep. 11, 2002

(86) PCT No.: PCT/JP02/09260
§ 371 (c)(1),
(2), (4) Date: Jul. 29, 2003

(87) PCT Pub. No.: WO03/028165
PCT Pub. Date: Apr. 3, 2003

(65) Prior Publication Data
US 2004/0047136 A1 Mar. 11, 2004

(30) Foreign Application Priority Data
Sep. 19, 2001 (JP) ......................... 2001-285436

(51) Int. Cl.[7] .............................. H05K 7/10
(52) U.S. Cl. .............. 361/760; 361/777; 257/777; 257/776; 257/778; 439/763; 439/876
(58) Field of Search ................. 361/760, 777; 257/778, 777, 776; 439/763, 876

(56) References Cited

U.S. PATENT DOCUMENTS

| | | | | |
|---|---|---|---|---|
| 6,163,461 A | * | 12/2000 | Watanabe | 361/760 |
| 6,426,880 B1 | * | 7/2002 | Chen | 361/773 |
| 6,583,981 B2 | * | 6/2003 | Moriwaki et al. | 361/321.2 |
| 6,643,142 B2 | * | 11/2003 | Aflenzer et al. | 361/813 |

FOREIGN PATENT DOCUMENTS

| | | |
|---|---|---|
| JP | 57-103421 | 6/1982 |
| JP | 2-291688 | 12/1990 |
| JP | 9-320662 | 12/1997 |
| JP | 10-41600 | 2/1998 |

* cited by examiner

Primary Examiner—David Martin
Assistant Examiner—Hung S. Bui
(74) Attorney, Agent, or Firm—Wenderoth, Lind & Ponack, L.L.P.

(57) ABSTRACT

The wiring board having terminals disclosed in this invention is aimed at providing a narrow pitch and downsized design for connecting circuit boards of various kinds of electronic devices. Each terminal 11 has an L-shaped or bar-shaped coupling section 11A having an uneven shape and held between a top substrate 6 and a bottom substrate 1.

9 Claims, 3 Drawing Sheets

WIRING BOARD HAVING TERMINAL

TECHNICAL FIELD

The present invention relates to a wiring board having terminals for use in connecting circuit boards in various kinds of electronic devices.

BACKGROUND ART

In recent years, many kinds of flexible wiring boards are employed to connect a plurality of circuit boards, having electronic components, in various kinds of electronic devices, or to connect circuit boards and motors or elements and the like.

Along with technological advances in electronic devices with high performance and downsized design, wiring boards are required which can carry an increased number of wiring patterns and have a downsized design with narrow distance between patterns that are so-called narrow-pitched patterns.

Now, a conventional wiring board having terminals is described with reference to FIG. 5. The figure is shown on an expanded scale in a thickness direction for easy understanding of the configuration.

FIG. 5 shows an exploded perspective view of a conventional wiring board. A thin layer of copper alloy or the like is etched to form a plurality of wiring patterns 2 on a top surface of flexible film-base substrate 1 composed of polyethylene terephthalate or the like, and the entire surfaces of wiring patterns 2 are covered with an insulating layer composed of polyester resin or the like, except for connecting sections 2A and 2B which are located at both ends of each wiring pattern 2.

Additionally, thin-metal-sheet terminal 5 having coupling section 5A formed with an approximate T-shape on one end is placed on the top surface of one end of connecting section 2A of base substrate 1. And, the bottom surface of flexible film-base top substrate 6 composed of polyethylene terephthalate or the like is coated with anisotropic conductive adhesives (ACA) 7 in which conductive powder made of polyester powder or nickel powder plated with noble metal is dispersed.

A wiring board having the above configuration is manufactured according to the steps of:
(a) placing coupling section 5A of thin-metal-sheet terminal 5 on connecting section 2A of base substrate 1;
(b) stacking top substrate 6 on which ACA 7 is applied previously on connecting section 2A; and
(c) heat-pressing from an upper side of top substrate 6.

Upon using the aforementioned wiring board for electronic devices, for example, lead wires for motors are soldered to one end of each terminal 5, and another end 2B is connected to a circuit board.

This configuration can connect a motor and a circuit board via terminals 5, anisotropic conductive adhesives 7 and wiring patterns 2.

In the above conventional wiring board, coupling section 5A which is held between base substrate 1 and top substrate 6, must be approximately T-shaped with protrusions on both sides of the terminal, and must apply ACA 7 around the protrusions 5B, to provide terminal 5 with a required pull-out strength in a direction shown by an arrow in FIG. 5.

Along with advances in high-density electric devices, which are required to have an increased number of wiring patterns, difficulty is caused in designing narrow-pitched patterns, because coupling sections 5A, having protrusions on both sides of approximately T-shaped terminal 5, occupy large spaces uselessly.

In other words, conventional wiring boards have drawbacks in providing narrow-pitched patterns for downsized designing.

DISCLOSURE OF THE INVENTION

The invention disclosed can provide a wiring board having terminals capable of downsizing as wiring patterns are formed at a narrow-pitch while keeping the pull-out strength of the terminals unchanged, to solve the aforementioned problems.

A wiring board disclosed in this invention comprises:
(a) a first substrate having a first surface, which forms a wiring pattern provided with a connecting section;
(b) a second substrate, which faces said first surface via anisotropic conductive adhesives; and
(c) plate-shaped metal terminal provided with a coupling section placed on said connecting section between said first substrate and said second substrate, wherein said coupling section has one of a bar-shape and an L-shape, and has an unevenly formed surface.

BEST MODE FOR CARRYING OUT THE INVENTION

The exemplary embodiments of this invention are described with reference to FIGS. 1 to 4. The figures are shown on an expanded scale in the thickness direction to explain the configuration clearly. Elements similar to those described in the conventional art have the same reference marks.

(Exemplary Embodiment 1)

Figure 1:
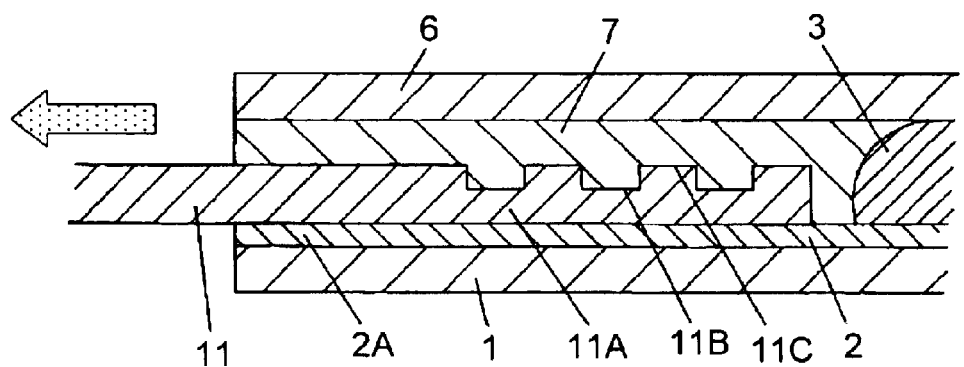
FIG. 1 illustrates a partial cross-sectional view showing a wiring board having terminals used in one exemplary embodiment of the present invention.
Figure 2:
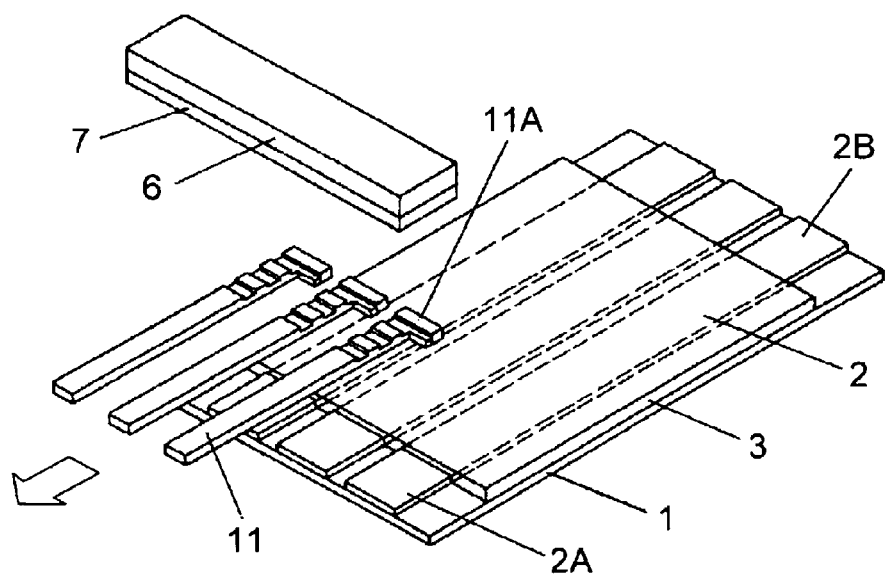
FIG. 2 illustrates an exploded perspective view showing a wiring board having terminals used in the one exemplary embodiment of the present invention.

FIG. 1 shows a partial cross-sectional view of a wiring board having terminals used in exemplary embodiment 1 of this invention, and FIG. 2 shows an exploded perspective view of the exemplary embodiment.

In FIGS. 1 and 2, a plurality of wiring patterns 2 are formed
(1) by etching a thin layer of copper alloy or the like, or
(2) by screen printing resins having dispersed carbon or metal powder such as silver or the like, on a top surface of flexible film 1 made of polyethylene terephthalate or polyimide resin or the like.

Additionally, the entire surface of each wiring pattern 2 is covered by an insulating layer 3 composed of polyester resin or the like except for the areas of connecting sections 2A and 2B, which are located at both ends of wiring pattern 2. And, thin-metal-sheet terminal 11 having coupling section 11A formed in an approximately L-shape on one end is placed on the top surface of connecting section 2A of base substrate 1.

Additionally, corrugated grooves (depressed portions) 11B and tongues (raised portions) 11C, formed in a direction of thickness by pressing or cutting, are provided on the top surface of coupling section 11A.

And, a bottom surface of flexible film substrate 6 composed of polyethylene terephthalate or the like is coated with anisotropic conductive adhesives (ACA) 7. ACA is a conductive resin made of polyester, epoxy or chloroprene rubber or the like, in which nickel powder or resin powder plated with noble metal is dispersed.

Now, a manufacturing method of a wiring board disclosed having the aforementioned components is described.

The manufacturing method comprises the steps of:

(a) placing coupling section 11A of thin-metal-sheet terminal 11 having a tongue-and-groove surface, on connecting section 2A of base substrate 1;

(b) stacking top substrate 6 having ACA 7 formed previously, on coupling section 11A;

(c) heat-pressing top substrate 6 from an upper side to soften ACA 7, wherein softened ACA 7 bonds bottom substrate 1 and top substrate 6 to hold terminals 11 in between, and fills grooves 11B in the surface of coupling section 11A with ACA 7; and (d) solidifying ACA 7 under room temperature and normal pressure to produce a wiring board having terminals.

As mentioned above, the wiring board having terminals disclosed in exemplary embodiment 1 has such a configuration that: top substrate 6 and bottom substrate 1 hold in between them coupling section 11A, formed in an approximate L-shape, of terminal 11; and coupling section 11A has corrugated grooves 11B and tongues 11C formed on the top surface.

The configuration can provide terminal 11 with enough pull-out strength in a longitudinal direction shown by an arrow mark in FIGS. 1 and 2, as ACA 7 is formed on surfaces of corrugated groove 11B and tongue 11C of coupling section 11A, so as to resist a pull-out force on the protruding portion of the terminal 11.

The terminal shape can be approximately L-shaped, protruding sideward to one side only, as introduction of a tongue-and-groove surface improves pull-out strength of the terminal. The terminal shape enables downsizing of a wiring board having terminals because a narrow-pitched pattern design of the terminals becomes possible due to the shape.

Although terminal 11 has an approximately L-shaped coupling section 11A in the above description, a simple bar-shaped tip can be possible for the terminal, as the introduction of the tongue-and-groove surface improves pull-out strength of the terminal. The configuration can provide a narrower pitch.

Figure 3:
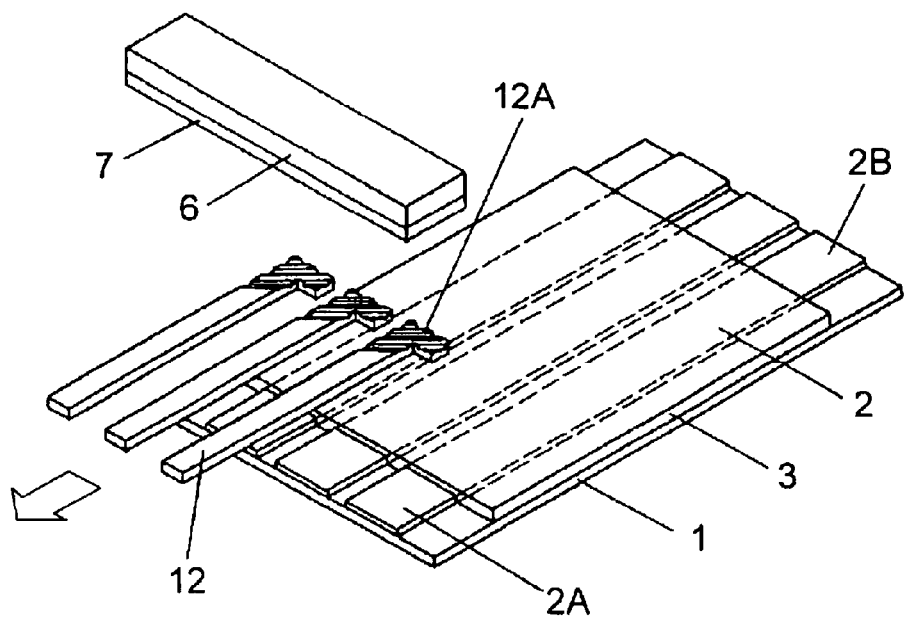
FIG. 3 illustrates an exploded perspective view showing a wiring board having terminals used in another exemplary embodiment of the present invention.

Moreover, by forming grooves 11B inclined as shown in an exploded perspective view in FIG. 3, the tongue-and-groove surface of coupling section 12A of terminal 12 can provide terminal 12 with enough pull-out strength in various directions including orthogonal, against the arrow as well as parallel to longitudinal direction shown by the arrow.

Moreover, instead of a tongue-and-groove surface formed parallel as described in exemplary embodiment 1, grooves and tongues can be formed uneven in depth or length. Additionally, grooves and tongues can be provided on both surface sides of the terminal.

(Exemplary Embodiment 2)

Figure 4:
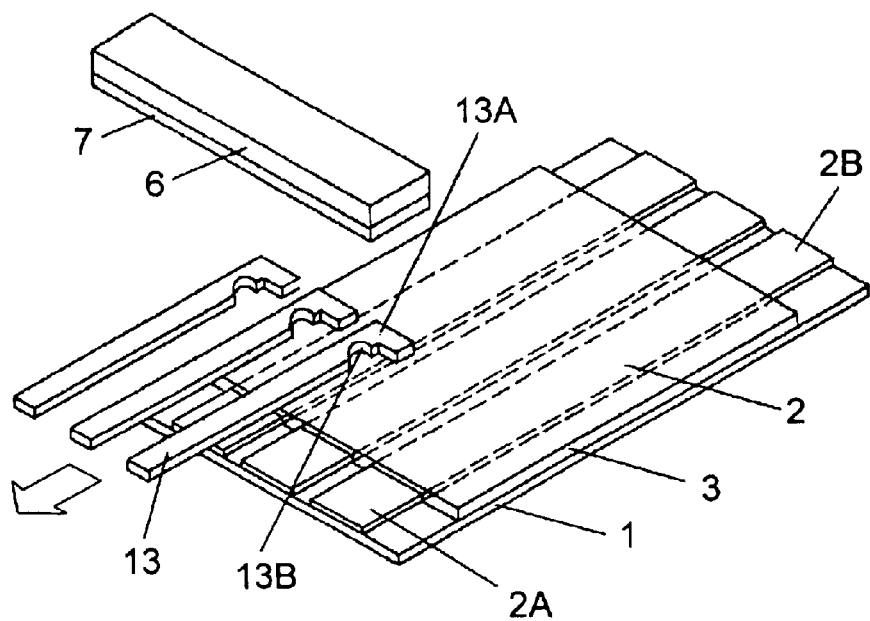
FIG. 4 illustrates an exploded perspective view showing a wiring board having terminals used in another exemplary embodiment of the present invention.
Figure 5:
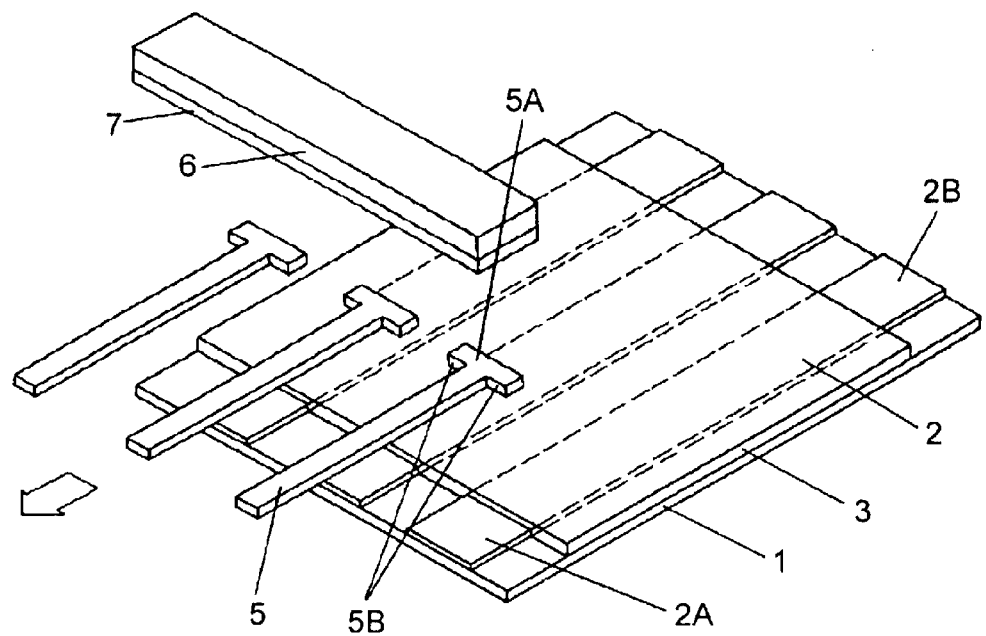
FIG. 5 illustrates an exploded perspective view showing a conventional wiring board having terminals.

Now, exemplary embodiment 2 has notch 13B formed on a periphery of coupling section 13A of each terminal 13, in addition to the tongue-and-groove surface used in exemplary embodiment 1, as shown in an exploded perspective view in FIG. 4. Notch 13B filled with anisotropic conductive adhesives (ACA) 7 can increase pull-out strength of terminal 13.

A wiring board used in exemplary embodiment 2 is manufactured similarly to that described in exemplary embodiment 1.

The method comprises the steps of:

(a) placing coupling section 13A of thin-metal-sheet terminal 13 on connecting section 2A of base substrate 1;

(b) stacking top substrate 6 on coupling section 13A;

(c) heat-pressing top substrate 6 from an upper side to soften ACA 7, wherein softened ACA 7 bonds bottom substrate 1 and top substrate 6 to hold terminals 13 in between, and fills notch 13B formed on a periphery of coupling section 13A with ACA 7; and (d) solidifying ACA 7 to fix top substrate 6, terminals 13 and base substrate 1 together, under room temperature and normal pressure, to produce a wiring board having terminals.

An extra manufacturing process for the terminal can be saved when notch 13B is formed on coupling section 13A at the same time that the terminal outline is punched out.

Additionally, a through-hole formed in coupling section 13A, instead of notch 13B of terminal 13, can provide similar effects. At the same time when terminal outline is punched out, a through-hole can be formed.

Although terminal 13 has an approximately L-shaped coupling section 13A in the above description, a simple bar-shaped tip can be possible for the terminal, as introduction of notch 13B improves the withdrawal resistance force of the terminal. The configuration enables a narrower pitch.

Needless to say, notches or through-holes can be formed by manufacturing methods other than punching, such as cutting, laser processing or etching or the like.

In addition, in the above-mentioned exemplary embodiments 1 and 2, the configuration is so described that ACA 7 is coated on the bottom surface of top substrate 6. However, the same exemplary embodiments can be carried out when ACA 7 is applied on connecting section 2A on the top surface of base substrate 1. In this case, tongue-and-groove surface portions formed on the bottom surface, rather than the top surface, of the terminal coupling section would be better to maintain pull-out strength, as the tongue-and-groove surface can be well filled with ACA 7.

Moreover, a complex type wiring board provided with an illuminating device is possible and would have a light-transmitting electrode layer, a light-emitting layer and a back electrode layer assembled together to form an electroluminecent (EL) element, though the top surface of base substrate 1 is described to have a plurality of wiring patterns only in the aforementioned configuration.

INDUSTRIAL APPLICABILITY

The wiring board having terminals disclosed in this invention provided with a narrow pitch and having a downsized design is aimed for use in electronic devices. Lead wires of motors or various elements are soldered on the terminals coupled to connecting sections on first ends of the wiring patterns, and connecting sections on the other ends of the wiring patterns are connected to a circuit board via connectors or the like. The configuration can connect motors and circuit boards with high density and in a compact manner via terminals, anisotropic conductive adhesive and wiring patterns.

What is claimed is:

1. A wiring board comprising:

a first substrate having first and second opposite surfaces;

a wiring pattern provided on said first surface of said first substrate, said wiring pattern including a connecting section;

a second substrate having first and second opposite surfaces, said first surface of said second substrate facing said first surface of said first substrate via a conductive adhesive; and an elongated plate-shaped metal terminal having first and second end portions, a coupling section being provided at said first end portion of said elongated plate-shaped metal terminal, and a protruding portion being provided at said second end portion of said elongated plate-shaped metal terminal;

wherein said coupling section of said elongated plate-shaped metal terminal has one of a bar-shape and an L-shape;

wherein said coupling section of said elongated plate-shaped metal terminal is sandwiched between said first surface of said first substrate and said first surface of said second substrate, and said protruding portion of said elongated plate-shaped metal terminal protrudes outwardly from between said first surface of said first substrate and said first surface of said second substrate; and wherein said coupling section of said elongated plate-shaped metal terminal is bonded between said first surface of said first substrate and said first surface of said second substrate by said conductive adhesive, and said coupling section of said elongated plate-shaped metal terminal has an unevenly formed surface to resist against pull-out of said coupling section from between said first and second substrates upon a pull-out force on said protruding portion of said elongated plate-shaped metal terminal.

2. The wiring board of claim 1, wherein said coupling section of said elongated plate-shaped metal terminal has a shape selected from one of a tongue-and-groove surface, a through-hole and a notch.

3. The wiring board of claim 2, wherein said conductive adhesive comprises an anisotropic conductive adhesive.

4. The wiring board of claim 1, wherein said conductive adhesive comprises an anisotropic conductive adhesive.

5. The wiring board of claim 1, wherein said shape is formed on at least one of a top surface and a bottom surface of said coupling section.

6. The wiring board of claim 5, wherein said tongue-and-groove surface has regular and parallel grooves.

7. The wiring board of claim 6, wherein said grooves are angled relative to a longitudinal direction of said elongated plate-shaped metal terminal.

8. The wiring board of claim 5, wherein said unevenly formed surface of said coupling section of said elongated plate-shaped metal terminal faces said first surface of said second substrate, and said conductive adhesive is between said coupling section of said elongated plate-shaped metal terminal and said first surface of said second substrate.

9. The wiring board of claim 5, wherein said unevenly formed surface of said coupling section of said elongated plate-shaped metal terminal faces said first surface of said first substrate, and said conductive adhesive is between said coupling section of said elongated plate-shaped metal terminal and said first surface of said first substrate.

* * * * *